(12) United States Patent
Yamanobe

(10) Patent No.: US 6,914,283 B2
(45) Date of Patent: Jul. 5, 2005

(54) SEMICONDUCTOR ELEMENT

(75) Inventor: Tomomi Yamanobe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 248 days.

(21) Appl. No.: 10/303,878

(22) Filed: Nov. 26, 2002

(65) Prior Publication Data

US 2003/0234412 A1 Dec. 25, 2003

(30) Foreign Application Priority Data

Jun. 25, 2002 (JP) .................................. 2002-184156

(51) Int. Cl.$^7$ ............................................. H01L 29/76
(52) U.S. Cl. ..................... 257/295; 257/296; 257/297; 257/298; 257/306
(58) Field of Search ................. 257/295, 296, 257/297, 298, 306

(56) References Cited

U.S. PATENT DOCUMENTS

| | | | |
|---|---|---|---|
| 6,218,197 B1 | 4/2001 | Kasai | |
| 6,342,712 B1 * | 1/2002 | Miki et al. | 257/295 |
| 6,355,952 B1 * | 3/2002 | Yamoto et al. | 257/295 |
| 6,465,826 B2 | 10/2002 | Kasai | |
| 6,512,256 B1 * | 1/2003 | Cuchiaro et al. | 257/295 |
| 6,570,203 B2 | 5/2003 | Hikosaka et al. | |
| 6,627,462 B1 * | 9/2003 | Yang et al. | 438/3 |
| 6,635,913 B2 * | 10/2003 | Miki et al. | 257/295 |
| 6,709,991 B1 * | 3/2004 | Kawahara et al. | 438/791 |
| 6,730,951 B2 * | 5/2004 | Nagano et al. | 257/296 |
| 6,800,889 B2 * | 10/2004 | Takatani et al. | 257/295 |
| 2001/0006239 A1 | 7/2001 | Yang et al. | |
| 2002/0135006 A1 | 9/2002 | Okudaira | |
| 2003/0148579 A1 | 8/2003 | Hikosaka et al. | |

FOREIGN PATENT DOCUMENTS

| | | |
|---|---|---|
| JP | 2001-15703 | 1/2001 |
| JP | 2001-135799 | 5/2001 |
| JP | 2001177069 | 6/2001 |
| JP | 2001-196551 | 7/2001 |
| JP | 2002-94021 | 3/2002 |

* cited by examiner

*Primary Examiner*—B. William Baumeister
*Assistant Examiner*—Douglas Menz
(74) *Attorney, Agent, or Firm*—Rabin & Berdo P.C.

(57) ABSTRACT

A semiconductor element in which the hydrogen-induced degradation of ferroelectric characteristics can be controlled includes a hydrogen penetration prevention film 400 for preventing hydrogen from penetrating into a ferroelectric film is formed above top electrodes 28. The width of the hydrogen penetration prevention film 400 in the direction orthogonal to a specific direction in which the top electrodes 28 are arranged in a parallel manner is set to be equal to or greater than the maximum width of the top electrodes 28 in the orthogonal direction. The hydrogen penetration prevention film 400 is used as a main WL that connects sub-WL drivers 60*a* and a main WL driver 60*b* extended in the same direction as the specific direction in the which the top electrodes 28 are aligned parallel to each other in a peripheral circuit 60.

13 Claims, 3 Drawing Sheets

SEMICONDUCTOR ELEMENT

BACKGROUND OF THE INVENTION

1. Field of the Invention

This invention relates to a semiconductor element, and more particularly to a semiconductor element equipped with nonvolatile ferroelectric memory.

2. Description of Related Art

Ferroelectric memory (nonvolatile memory) has recently come into use as a type of memory capable of operating at high speeds, low voltages, reduced energy consumption, and the like in response to the need for achieving higher integration in semiconductor memory devices.

Ferroelectric memory is a type of memory that has a ferroelectric memory cell structure based on transistors and ferroelectric capacitors and that utilizes the ability of a ferroelectric film (which is used in capacitors for accumulating and storing electric charges) to reverse and maintain an electric field as a result of a spontaneous polarization occurring in the film itself.

There are, for example, 2T2C (two-transistor, two-capacitor) memory cells in which each ferroelectric memory cell comprises two transistors and two ferroelectric capacitors. 2T2C memory cells have excellent fatigue resistance and can operate stably despite the reduced capacitor polarization brought about by data read/write cycles, but the surface area occupied by each memory cell is considerable, making this type of memory cells unsuitable for higher integration.

In view of this, research has been conducted in order to achieve higher integration by devising 1T1C (one-transistor, one-capacitor) memory cells in which each ferroelectric memory cell comprises a single transistor and a single ferroelectric capacitor, but these cells still have numerous problems that make it impossible to ensure stable operation.

Research has also been performed in recent years into ferroelectric memory mixed LSI circuits in which ferroelectric memory is mounted not only as general-purpose memory but also in system LSI. Such ferroelectric memory mixed LSI circuits were expected to be used in applications that required small chip sizes and low power consumption, such as chips for IC cards.

However, the following typical problems are encountered when, for example, such a ferroelectric memory mixed LSI circuit is created. These problems result from the fact that SBT ($SrBi_2Ta_2O_9$), PZT ($PbZr_xTi_{1-x}O_3$), and other metal oxide films are commonly used as ferroelectric films.

For example, steps for manufacturing a common semiconductor device comprise formation steps such as a step for forming an interlayer insulating film, a step for forming a passivation film, and a molding step, and all these steps are performed in a reductive atmosphere based on hydrogen ($H_2$) gas or the like.

As a result, the characteristics of ferroelectric films (hereinafter abbreviated as "ferroelectric characteristics") are degraded because these films are reduced by being exposed to a reducing atmosphere.

Specifically, the ferroelectric characteristics undergo considerable degradation because a large amount of hydrogen diffuses into the ferroelectric film by the generation of hydrogen plasma in a step in which, for example, passivation and film forming are performed in a reducing atmosphere.

In this case, a heat treatment can be performed in order to restore the degraded ferroelectric characteristics, but such heat treatment is unacceptable when the wiring material has low heat resistance.

In view of this, methods have been proposed in which the degradation of ferroelectric characteristics is prevented by covering the surface of a ferroelectric capacitor with a coating film to protect the dielectric film. However, the addition of a step for forming a coating film results in higher manufacturing costs, and it is difficult to form a coating film that would have excellent step coverage on the surface of a stepped ferroelectric capacitor.

Consequently, it has conventionally been considered difficult to create a ferroelectric memory mixed LSI circuit by mounting, for example, logic units and other semiconductor devices on the same substrate on which ferroelectric memory is formed.

A need thus existed in the past for a technique in which the aforementioned drawbacks would be overcome in a technologically acceptable manner.

SUMMARY OF THE INVENTION

In view of this, the semiconductor element of this invention has the following structural features.

Specifically, a semiconductor element having a transistor comprising a first main electrode, a second main electrode, and a control electrode; and a capacitor sequentially comprising a bottom electrode, a ferroelectric film, and a top electrode on a semiconductor substrate, wherein a hydrogen penetration preventing film is provided via an insulating film on the side opposite the semiconductor substrate, with the top electrode interposed therebetween.

The ferroelectric film is thus prevented from being exposed to hydrogen because a hydrogen penetration preventing film is provided for controlling the penetration (or diffusion) of hydrogen into the ferroelectric film.

As a result, hydrogen is prevented from penetrating into the ferroelectric film and degrading the ferroelectric characteristics when, for example, a ferroelectric memory mixed LSI circuit is produced in a step in which treatment is performed in a reducing atmosphere.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

Figure 1:
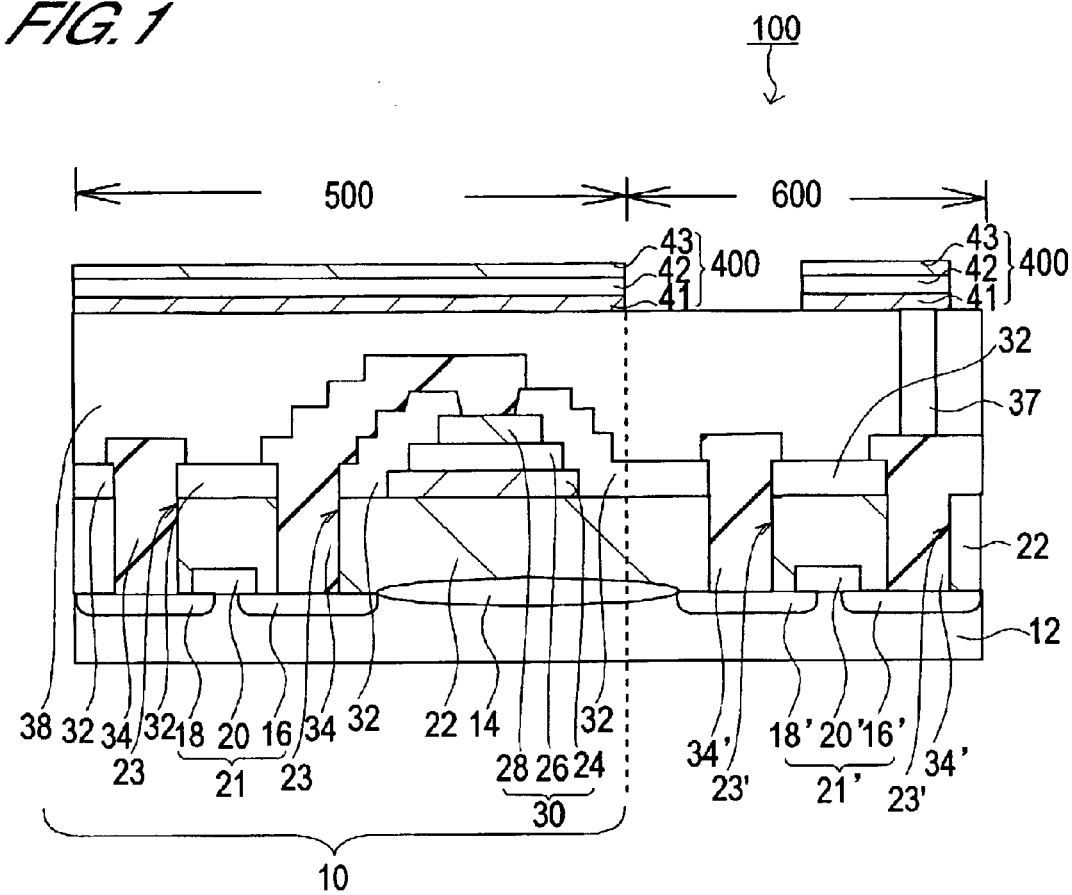
FIG. 1 is a schematic fragmentary cross-sectional view of the first embodiment of this invention.

Embodiments of this invention will now be described with reference to the drawings. The drawings merely outline the shape, size, and layout relation of each constituent component to the extent sufficient to describe this invention, so this invention is not limited to the illustrated examples. The drawing referred to as a plan view does not always picture members that are superposed from above or lines that are obscured from view by the structure. Hatching (slanted lines) designed to indicate a cross section is shown only partially in order to make it easier to understand the drawings. The description that follows merely covers preferred examples, and the numerical conditions referred to herein are by no means limited to those cited in the preferred examples. In addition, identical symbols are attached to the same constituent components in the drawings, and redundant descriptions thereof are sometimes omitted.

First Embodiment

Figure 2:
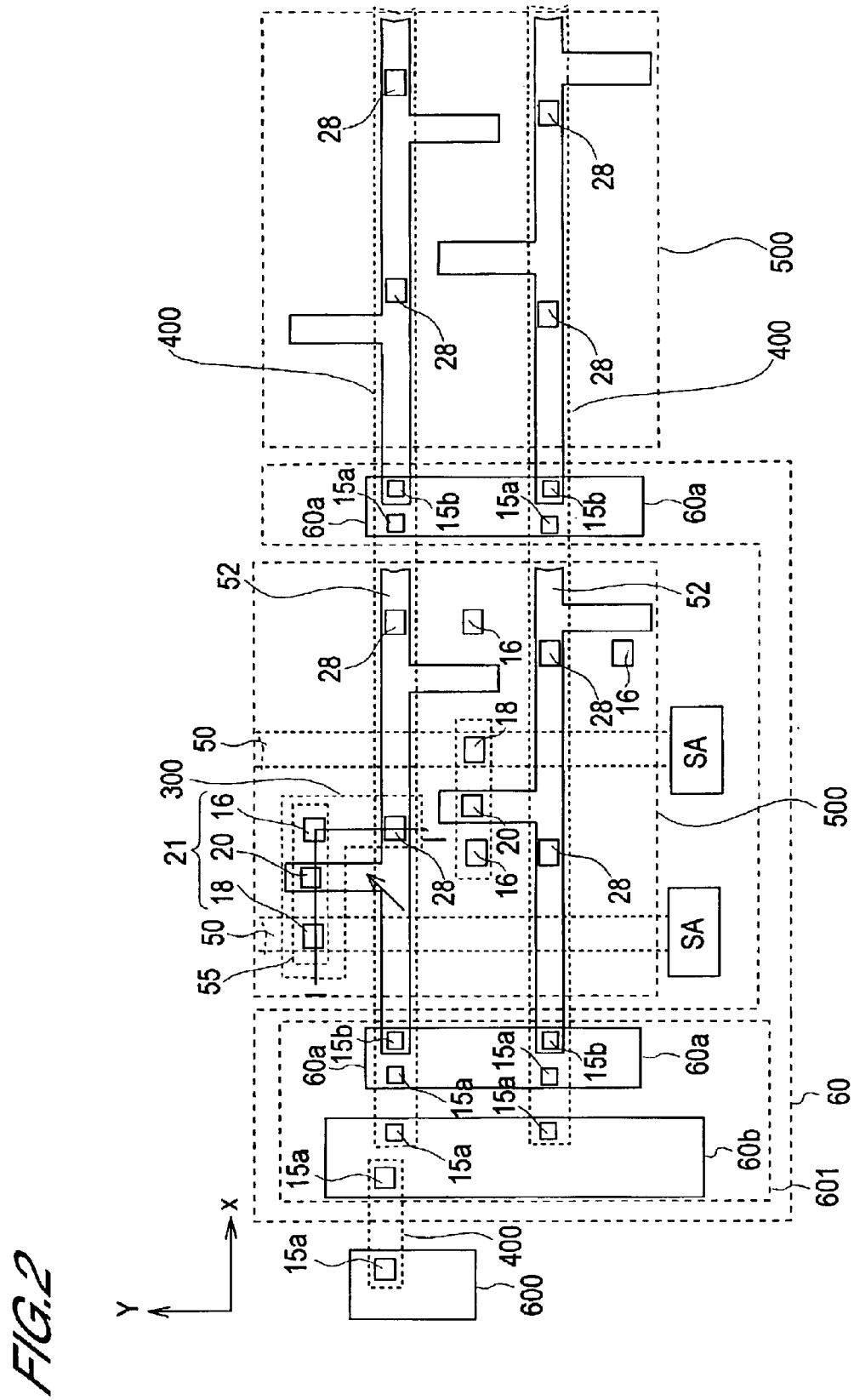
FIG. 2 is a schematic plan view of the semiconductor element of this invention.

FIG. 1, which is a schematic fragmentary cross-sectional view of a semiconductor element 100 pertaining to this embodiment, depicts that portion of the schematic plan view of the semiconductor element 100 pertaining to this embodiment in FIG. 2 in which a cross section is viewed in the direction of the arrow in the drawing. The cross section is obtained by cutting an arbitrary ferroelectric memory cell (referred to hereinbelow as "memory cell") 300 with a ferroelectric memory unit 500 along solid line I–I'.

Before FIG. 1 is described, a description will be given with reference to FIG. 2 of the semiconductor element 100 pertaining to this embodiment.

The semiconductor element 100 of this embodiment comprises a ferroelectric memory unit 500, a peripheral circuit unit 60 designed for energizing the ferroelectric memory unit 500 and disposed on the same semiconductor substrate with the ferroelectric memory unit 500, and a logic unit 600 with a logic circuit that functions as a switching circuit for the peripheral circuit 60 (*1), as shown in FIG. 2.

Specifically, the ferroelectric memory unit 500 comprises a plurality of memory cells 300 (only one memory cell is pictured here), and each memory cell 300 comprises a transistor 21 and a ferroelectric capacitor (only the top electrode 28 is pictured here). The transistor 21 comprises a source region 16 and a drain region 18 disposed on both sides of a gate electrode 20 inside an active region 55. The drain region 18 is connected to a bit line 50, and the gate electrode 20 is connected to a sub-word line (sub-WL (Word Line)) 52 (described below). Each bit line 50 is connected to a sense amplifier (SA).

The peripheral circuit 60 may be a word line driver, plate line driver, row decoder, column decoder, or the like. In this case, the first word line driver 601 is shown as a peripheral circuit unit 60. The first WL driver 601 comprises sub-word line drivers (sub-WL drivers) 60a for controlling data reading and writing via sub-WLs 52 from each memory cell 300, and a main WL driver 60b for selectively controlling the sub-WL drivers 60a via a main WL (composed of a hydrogen penetration preventing film 400 in this embodiment (described below)).

The logic unit connected to the peripheral circuit 60 comprise a second WL driver 600.

In this arrangement, the sub-WL drivers 60a are provided to each adjacent ferroelectric memory unit 500 and are connected to the gate electrodes 20 by the sub-WLs 52. The sub-WL drivers 60a disposed on both sides of the ferroelectric memory unit 500 are connected to the main WL driver 60b by the main WL (hydrogen penetration preventing film 400), which extends crosswise over the memory cell. In the drawing, the first conductors 15a show connections with the main WL (hydrogen penetration preventing film 400), and the second conductors 15b show connections with the sub-WLs 52.

The semiconductor element 100 of this embodiment will now be described with reference to FIG. 1. In the drawing, the ferroelectric memory unit 500 and logic unit 600 are pictured parallel to each other for the sake of convenience, but the positional arrangement is not limited to this option alone.

Transistors 21 and capacitors 30 are provided to the ferroelectric memory unit 500. Each transistor 21 comprises a gate electrode (control electrode) 20 at a location that extends over a semiconductor substrate 12 between the source region (source electrode (first main electrode)) 16 and drain region (drain electrode (second main electrode)) 18 formed in the a semiconductor substrate 12. Each capacitor 30 comprises a bottom electrode 24, a ferroelectric film 26, and a top electrode 28 sequentially arranged facing the semiconductor substrate 12 on an insulating film 22 for covering the transistors 21. An insulating film 32 for covering the surface of the capacitors 30 is provided such that the top electrodes 28 are partially exposed. The top electrodes 28 and source regions 16 are electrically connected by a wiring layer 34 configured to bury the contact holes 23 formed in the insulating film 22. The drain regions 18 and bit lines (see FIG. 2) are electrically connected by the wiring layer 34. An insulating film 38 with a flat surface is formed such that the entire surface of the semiconductor substrate 12 is covered. The transistors 21 are MOSFETs, and either n-channel or p-channel MOSFETs may be appropriately selected as needed.

In conventional practice, a passivation film is subsequently provided to the above-described structure when a ferroelectric memory mixed LSI circuit is created.

However, the ferroelectric film 26 is reduced by being exposed to a reducing atmosphere during the formation of the passivation film, causing the ferroelectric characteristics to deteriorate, as described above.

In view of this, a hydrogen penetration preventing film 400 is formed on the insulating film 38 in accordance with this embodiment, as shown in FIG. 1.

Also in this embodiment, not only is the hydrogen penetration preventing film 400 provided such that the width thereof in the direction (in the arrangement shown in the drawing, the Y-direction) orthogonal to the specific direction (in the arrangement shown in the drawing, the X-direction) in which the top electrodes 28 are aligned parallel to each other is equal to or greater than the maximum width of the top electrodes 28 in the orthogonal direction, but this hydrogen penetration preventing film 400 is also used as a first wiring layer that extends in the same direction as the specific direction (in the arrangement shown in the drawing, the X-direction) in which the top electrodes 28 are aligned parallel to each other, as shown in FIG. 2.

As a result of extensive research into the effect whereby which the hydrogen penetration preventing film 400 controls the penetration (diffusion) of hydrogen into ferroelectric films, the inventors discovered that a characteristic capacitor value that satisfies the operating margin of a ferroelectric memory can be secured by providing the hydrogen penetration preventing film 400 such that the width thereof in the Y-direction (see FIG. 2) is equal to or greater than at least the maximum width of the top electrodes 28 in the same direction.

More specifically, the characteristic capacitor value that satisfies the operating margin of a ferroelectric memory is set such that the lower limit thereof is 10 $\mu C/cm^2$.

In view of this, the characteristic capacitor value will be 10 $\mu C/cm^2$ if the width of the hydrogen penetration preventing film 400 in relation to the width of the top electrodes 28 (both in the Y-direction in FIG. 2) is set to 1.0; that is, if a hydrogen penetration preventing film 400 having the same width as the top electrodes 28 is formed on the top electrodes 28. In addition, the characteristic capacitor value will be 7–9 $\mu C/cm^2$ if the width of the hydrogen penetration preventing film 400 in relation to the width of the top electrodes 28 is set to 0.8. Furthermore, the characteristic capacitor value will be 12–14 $\mu C/cm^2$ if the width of the hydrogen penetration preventing film 400 in relation to the width of the top electrodes 28 is set to 1.4.

The inventors thus discovered that the width of the hydrogen penetration preventing film should be equal to or greater than at least the maximum width of the top electrodes 28 in order to achieve at least the lower limit (10 $\mu C/cm^2$) of the characteristic capacitor value.

Another feature of this embodiment is that the main WL, which extends in the same direction as the specific direction in which the top electrodes 28 are arranged parallel to each other, is selected as the first wiring layer that doubles as the patterned hydrogen penetration preventing film 400. In addition, the main WL is a heavily used wiring connected both to the main WL driver 60b disposed in the vicinity of the ferroelectric memory unit 500 and to a plurality of sub-WL drivers 60a, so the device can be designed much more compactly by allowing the layer to double as the hydrogen penetration preventing film 400.

At least one hydrogen-occluding metal film selected from titanium (Ti) films, palladium (Pd) films, and zirconium (Zr) films is provided as the hydrogen penetration preventing film 400 that satisfies the above-described arrangement conditions in this embodiment, as shown in FIG. 1.

In view of this, the hydrogen penetration preventing film 400 of this embodiment is configured by the sequential placement of a titanium nitride (TiN) film 42 and an aluminum (Al) film 43 on a titanium (Ti) film 41 (hydrogen-occluding metal film). As used herein, the term "hydrogen-occluding metal film" refers to a metal film that has characteristics whereby the film readily reacts with hydrogen and stores a large amount of hydrogen between the lattices of metal crystals.

Figure 4:
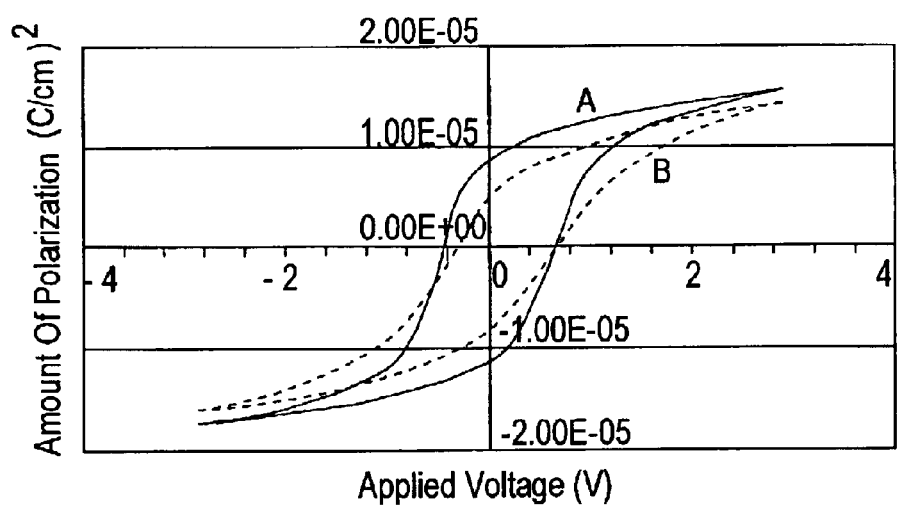
FIG. 4 is a diagram for illustrating the semiconductor element of this invention.

Next, FIG. 4 depicts the hysteresis (ferroelectric capacitor) characteristics (solid line A) that a capacitor 30 covered with the hydrogen penetration preventing film 400 in accordance with this embodiment acquires after a passivation film is formed. In the drawing, the horizontal axis depicts the voltage (V) applied to the capacitor; the vertical axis, the amount of polarization (C/cm$^2$) per unit surface area. The hysteresis profile (broken line B) that a capacitor not covered with a hydrogen penetration preventing film acquires after the passivation film is formed is also shown for the sake of comparison.

A comparison of the hysteresis characteristics shows that solid line A is more rectangular than broken line B and that the presence of the hydrogen penetration preventing film 400 controls the degradation of ferroelectric characteristics during the formation of a passivation film.

It is apparent from the above description that penetration (diffusion) of hydrogen into a ferroelectric film is controlled in this embodiment by the hydrogen penetration preventing film 400, allowing the ferroelectric characteristics to be degraded to a lesser extent, and that the patterned hydrogen penetration preventing film 400 can be used as the main WL, making it possible to obtain a semiconductor element suited to higher integration.

The method for manufacturing this semiconductor element 100 will now be described with reference to FIG. 3.

Transistors 21 comprising a first main electrode 16, second main electrode 18, and control electrode 20, as well as capacitors 30 sequentially comprising a bottom electrode 24, ferroelectric film 26, and top electrode 28 are first formed on the semiconductor substrate 12 in a step for forming the capacitors and transistors provided to the ferroelectric memory unit 500.

In this embodiment, a logic unit 600 is concurrently formed outside the area occupied by the ferroelectric memory unit 500 on a semiconductor substrate 12 during the formation of the ferroelectric memory unit 500 to create a ferroelectric memory mixed LSI circuit. In the drawing, the ferroelectric memory unit 500 and logic unit 600 are pictured parallel to each other for the sake of convenience, but the positional arrangement thereof is not limited to this option alone. In addition, a MOSFET, which is a constituent element of the second WL driver 600, is shown herein as an example of a logic unit 600, but this is not the only possible option.

Specifically, first main electrodes (source regions) 16, second main electrodes (drain regions) 18, and control electrodes (gate electrode)s 20 are provided and transistors 21 are formed by a conventionally known method on the side of a semiconductor substrate 12 facing the ferroelectric memory unit 500. In addition, source regions 16', drain regions 18', and gate electrodes 20' are provided and transistors 21' are formed by a conventionally known method on the side of the semiconductor substrate 12 facing the logic unit 600. In addition, an element-separating film 14 insulates and separates adjacent elements.

A silicon oxide (SiO$_2$) film is subsequently formed as an insulating film 22 in a thickness of 1200 nm on the transistors (21, 21') by a conventionally known method, and bottom electrodes 24 consisting of platinum (Pt) and having a thickness of 150 nm, a ferroelectric film 26 consisting of SrBi$_2$Ta$_2$O$_9$ and having a thickness of 180 nm, and top electrodes 28 consisting of platinum and having a thickness of 200 nm are then sequentially provided to form a capacitor 30 on the insulating film 22. The ferroelectric film may also comprise, for example, a PbZrTiO$_3$ film, Ba$_x$Sr$_{1-x}$TiO$_3$ film, $Pb_5Ge_3O_{11}$ film, $Bi_4Ti_3O_{12}$ film, or the like in addition to the $SrBi_2Ta_2O_9$ film. An insulating film 32 composed of a silicon oxide film ($SiO_2$) is then formed in a thickness of 300 nm on the semiconductor substrate 12.

The top electrodes 28 and source regions 16, and the drain regions 18 and bit lines (not shown in this drawing; see FIG. 2) are then electrically connected by a conventionally known method on the side of the ferroelectric memory unit 500 via a wiring layer 34 (a TiN film with a thickness of 150 nm and an Al film with a thickness of 500 nm) buried in contact holes 23. In addition, each of the source regions 16' and drain regions 18' are electrically connected on the side of the logic unit (second WL driver) 600 via a wiring layer 34' buried in the contact holes 23'.

An insulating film 38 composed of a silicon oxide film with a flattened surface is subsequently formed in a thickness of 1700 nm to cover the semiconductor substrate 12.

In the subsequent step for forming a metal film in accordance with this embodiment, a metal film is formed as the hydrogen penetration preventing film 400 on the ferroelectric memory unit 500 via the insulating film 38 on the side opposite the semiconductor substrate 12, with the top electrodes 28 interposed therebetween, and the metal film is formed at the same time as a second wiring layer on the logic unit (second WL driver) 600.

Specifically, a feature of this embodiment is that the hydrogen penetration preventing film 400 of the ferroelectric memory unit 500 can be formed at the same time with the second wiring layer on the side facing the logic units 600.

It is therefore unnecessary to add a new step for forming a hydrogen penetration preventing film 400 in the ferroelectric memory unit 500, and an economically efficient semiconductor process can be performed.

Figure 3A:
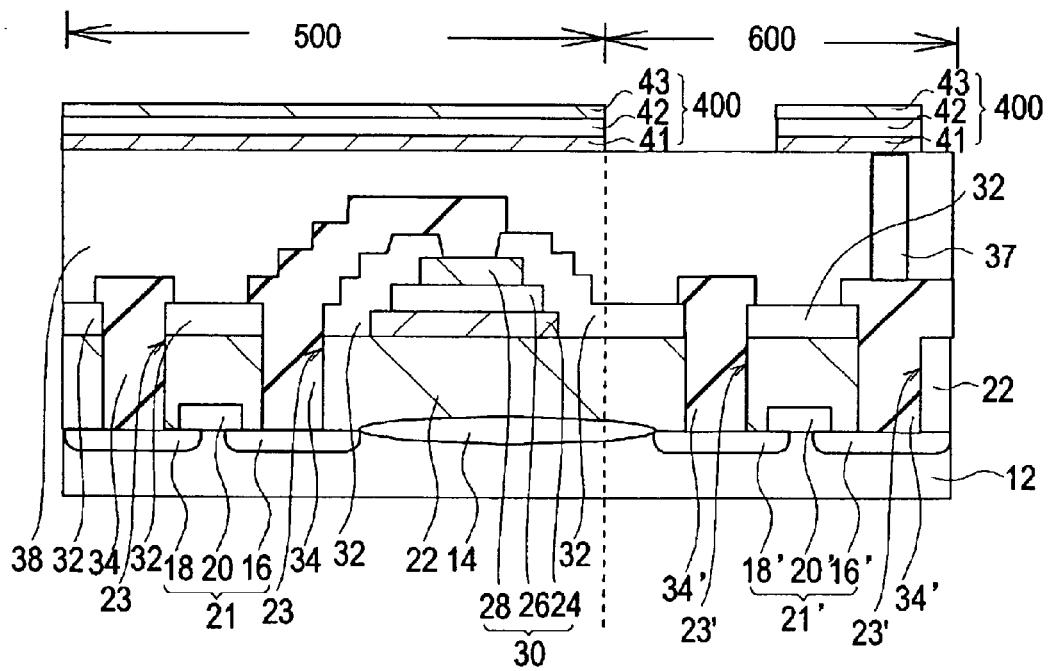
FIGS. 3A and 3B are manufacturing process drawings of the semiconductor element of the present invention.

In view of this, a titanium nitride (TiN) film 42 and an aluminum (Al) film 43 are sequentially formed in thicknesses of 100 nm and 700 nm, respectively, on the titanium (Ti) film 41 (hydrogen-occluding metal film; thickness: 30 nm) to produce a metal film (hydrogen penetration preventing film 400) on the insulating film 38 on the side facing the ferroelectric memory unit 500 in this embodiment, and another metal film (hydrogen penetration preventing film 400) is formed as a second wiring layer connected by means of a tungsten (W) via 37 with the wiring layer 34' on the insulating film 38 on the side facing the logic unit 600 (FIG. 3A). The thickness of the titanium film 41 in this embodiment is set with consideration for the film formation time and the ability to control the penetration of hydrogen into the ferroelectric film 26. In the case under consideration, the thickness should fall between 30 nm and 150 nm.

The device is subsequently etched by Cl2, BCl2, or another etching gas such that the hydrogen penetration preventing film 400 on the side facing the ferroelectric memory unit 500 is left behind in an area such as the one described above; that is, an area in which the width of the film is equal to or greater than the maximum width of the top electrodes 28 in the Y-direction.

More specifically, the plate lines connected to the bottom electrodes 24 are provided with a 400-nm margin on either side to exclude shorting with the top electrodes 28, and the width of the lines in the Y-direction is set to 2800 nm, assuming, for example, that the maximum width of the top electrodes 28 (in the Y-direction; see FIG. 2) formed in a strip in the X-direction (see FIG. 2) is 2000 nm.

The width of the hydrogen penetration preventing film 400 in the Y-direction in this embodiment is therefore substantially the same as the width (in the Y-direction) of the plate lines (not shown) connected to the bottom electrodes 24; that is, 2800 nm.

As a result, the width of the hydrogen penetration preventing film 400 is 2800/2000=1.4 in relation to the width of the top electrodes 28. As has already been indicated above, the width of the hydrogen penetration preventing film 400 should be equal to or greater than at least the width of the top electrodes.

However, the width of the hydrogen penetration preventing film 400 should preferably be about 1.4 times the width of the top electrodes because of considerations related to the effect of preventing hydrogen from penetrating into the ferroelectric film and to the need to use less space in order to achieve a higher degree of integration. In addition, the maximum width of the hydrogen penetration preventing film 400 in the Y-direction should preferably be about 2.4 times the width of the top electrodes to prevent shorting between adjacent parts of the hydrogen penetration preventing film.

Figure 3B:
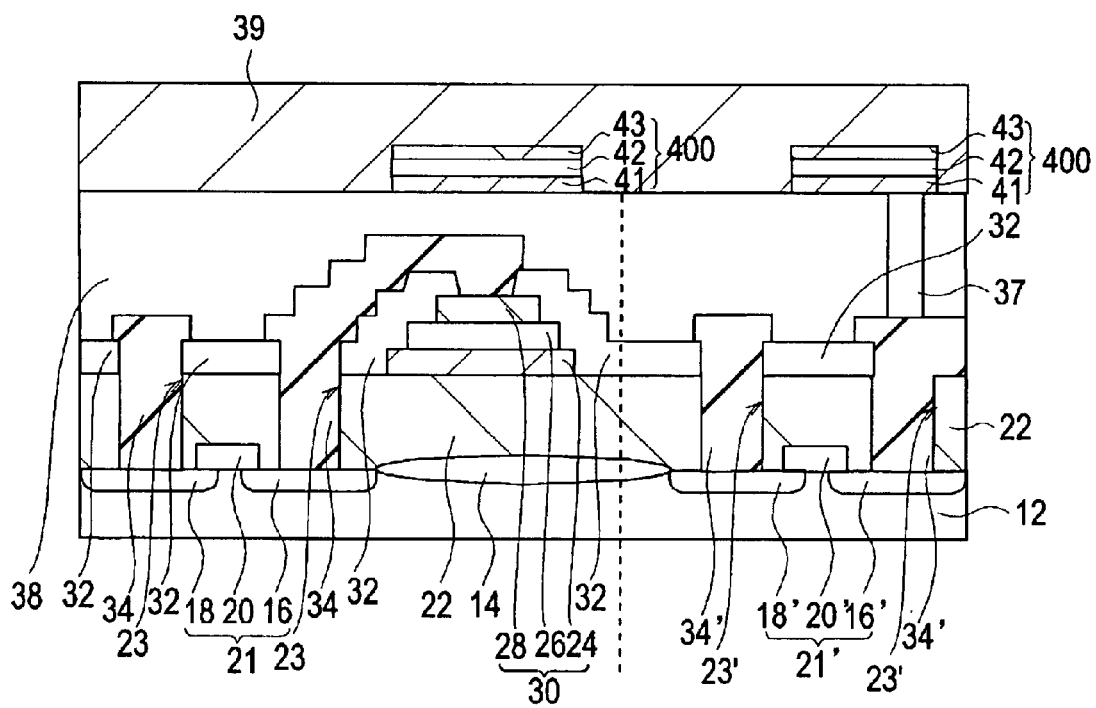

A passivation film 39 composed of a silicon nitride film (SiN) is then formed in a thickness of 850 nm such that the entire semiconductor substrate 12 is covered (FIG. 3B). In this arrangement, exposure of the ferroelectric film 26 to hydrogen is controlled by the hydrogen penetration preventing film 400. A protective film 39 (*2) is then formed.

With the method described above, it is possible to form a semiconductor element provided with a transistor comprising a first main electrode and a second main electrode formed on a semiconductor substrate, as well as a control electrode formed at a position sandwiched between the first and second main electrodes on the semiconductor substrate; and a capacitor comprising a bottom electrode as well as a ferroelectric film and a top electrode sequentially formed on the bottom electrode.

In this semiconductor element, a metal film (hydrogen penetration preventing film) is formed via an insulating film on the side opposite the semiconductor substrate, with the top electrode interposed therebetween. The metal film is formed as the second wiring layer of an integrated circuit provided outside the area in which the transistor and capacitor are formed.

In this embodiment, the step for forming a hydrogen penetration preventing film 400 in the ferroelectric memory unit 500 can be combined with the step for forming the second wiring layer in the logic unit 600, making it unnecessary to add a new step and allowing greater economic efficiency to be achieved.

Second Embodiment

The main difference of the second embodiment from the first embodiment is that the hydrogen penetration preventing film 400 sequentially comprises a titanium film, titanium nitride film, aluminum film, titanium film, and titanium nitride film. Specifically, the hydrogen penetration preventing film 400 of this embodiment has more hydrogen-occluding metal films than does the first embodiment. The hydrogen penetration preventing film 400 of this embodiment is not limited to a structure that comprises a plurality of same-type hydrogen-occluding metal films, and may also be composed of a plurality of dissimilar hydrogen-occluding metal films, although using same-type hydrogen-occluding metal films is preferred because such use makes it simpler to form the hydrogen penetration preventing film 400 and to manage the film materials.

According to an aspect of this embodiment, a step for forming a transistor and a capacitor is first performed in the same manner as in the first embodiment, and the following metal films constituting the hydrogen penetration preventing film 400 are then sequentially formed in a step for forming metal films on the insulating film 38 on the side facing the ferroelectric memory unit 500: a titanium film with a thickness of 30 nm, a titanium nitride film with a thickness of 100 nm, an aluminum film with a thickness of 700 nm, a titanium film with a thickness of 50 nm, and a titanium nitride film with a thickness of 100 nm. Another metal film (=hydrogen penetration preventing film 400) is formed at the same time as a second wiring layer on the insulating film on the side of the logic unit 600. The thickness of the titanium film on the aluminum film should be set to 30 nm or greater in order to prevent degradation of the ferroelectric characteristics.

As is evident from the above description, the hydrogen penetration preventing film of this embodiment has more hydrogen-occluding metal films than does the first embodiment. It is therefore possible to control penetration (diffusion) of hydrogen into the ferroelectric film 26 with greater efficiency than in the first embodiment.

Third Embodiment

The main difference of the third embodiment from the first embodiment is that at least one film selected from among metal oxide films such as aluminum oxide ($Al_2O_3$) films, tantalum oxide ($Ta_2O_5$) films, and titanium oxide ($TiO_2$) films is provided as the hydrogen penetration preventing film 400. Metal oxide films function as hydrogen-stopping barrier films for preventing hydrogen from penetrating (diffusing) into the metal oxides, and because these films have high density and stable film properties, there is no danger that the films will be degraded during subsequent steps. As used herein, the term "hydrogen-stopping barrier film" refers to a film that has characteristics whereby the film as such is reduced by reaction with hydrogen, and oxygen is released.

In view of this, the hydrogen penetration preventing film of this embodiment is configured by the sequential formation of a titanium film, titanium nitride film, aluminum film, and aluminum oxide film.

According to this embodiment, a step for forming a transistor and a capacitor is first performed in the same manner as in the first embodiment, and the following metal films constituting a hydrogen penetration preventing film are then formed in a step for forming metal films on the insulating film 38 on the side facing the ferroelectric memory unit 500: a titanium film with a thickness of 30 nm, a titanium nitride film with a thickness of 100 nm, an aluminum film with a thickness of 700 nm, and an aluminum oxide film with a thickness of 50 nm. Another metal film (=hydrogen penetration preventing film 400) is formed at the same time as a second wiring layer on the insulating film on the side of the logic unit 600. The thickness of the aluminum oxide film should be set to 50 nm or greater in order to prevent degradation of the ferroelectric characteristics.

As is evident from the above description, the hydrogen penetration preventing film of this embodiment comprises an aluminum oxide film as a metal oxide film (hydrogen-stopping barrier film) in addition to a hydrogen-occluding metal film. It is therefore possible to control penetration (diffusion) of hydrogen into the ferroelectric film with greater efficiency than in the first embodiment.

The conditions and other features of the embodiments of this invention are not limited solely to the combinations described above. This invention can therefore be used by combining appropriate conditions during appropriate arbitrary stages.

For example, this invention can still be used in an appropriate manner when the hydrogen-occluding metal films used in the above-described embodiments are, for example, hydrogen-occluding alloys or other materials having the same functions.

This invention may also have the following favorable configurations when put to practical use.

The semiconductor element of this invention may have a transistor comprising a first main electrode, second main electrode, and control electrode on a semiconductor substrate; and a capacitor sequentially comprising a bottom electrode, a ferroelectric film, and a top electrode. In addition, the semiconductor element of this invention may be provided with at least one metal film selected from titanium films, palladium films, and zirconium films via an insulating film on the side opposite the semiconductor substrate, with the top electrode interposed therebetween.

In the aforementioned semiconductor element, a plurality of top electrodes are arranged in parallel to each other in a specific direction, and the width of the metal film in the direction orthogonal to the specific direction is equal to or greater than the maximum width of the top electrodes in the orthogonal direction.

In addition, the metal film is adapted to function as a first wiring layer that extends in the same direction as the specific direction in which the top electrodes are arranged in a parallel manner.

The thickness of the metal film is set to 50 nm or greater.

Furthermore, the semiconductor element of this invention may have a transistor comprising a first main electrode, second main electrode, and control electrode on a semiconductor substrate; and a capacitor sequentially comprising a bottom electrode, a ferroelectric film, and a top electrode. In addition, the semiconductor element of this invention may be provided with a metal oxide film via an insulating film on the side opposite the semiconductor substrate, with the top electrode interposed therebetween.

A plurality of top electrodes are arranged in parallel to each other in a specific direction, and the width of the metal film in the direction orthogonal to the specific direction is equal to or greater than the maximum width of the top electrodes in the orthogonal direction.

In addition, the metal oxide film is adapted to function as a first wiring layer that extends in the same direction as the specific direction in which the top electrodes are arranged in a parallel manner.

The metal oxide film is at least one film selected from aluminum oxide films, tantalum oxide films, and titanium oxide films.

The film thickness is 50 nm or greater.

What is claimed is:

1. A semiconductor element, comprising a transistor provided with a first main electrode, second main electrode, and control electrode on a semiconductor substrate; and a capacitor sequentially provided with a bottom electrode, a ferroelectric film, and a top electrode, wherein a hydrogen penetration preventing film is provided on the side opposite the semiconductor substrate across an insulating film, with the top electrode interposed therebetween;

wherein a plurality of top electrodes are arranged in parallel to each other in a specific direction; and wherein the hydrogen penetration preventing film is used as a wiring layer that extends in the same direction as said specific direction in which the top electrodes are arranged in a parallel manner.

2. The semiconductor element according to claim 1, wherein the width of the hydrogen penetration preventing film in the direction orthogonal to the specific direction is equal to or greater than the maximum width of the top electrodes in said orthogonal direction.

3. The semiconductor element according to claim 1, wherein the hydrogen penetration preventing film comprises a hydrogen-occluding metal film.

4. The semiconductor element according to claim 3, wherein the hydrogen-occluding metal film is at least one film selected from titanium films, palladium films, and zirconium films.

5. The semiconductor element according to claim 3, wherein the thickness of the hydrogen-occluding metal film is 50 nm at minimum.

6. The semiconductor element according to claim 1, wherein the hydrogen penetration preventing film comprises a metal oxide film.

7. A semiconductor element, comprising a transistor provided with a first main electrode and a second main electrode formed on a semiconductor substrate, and with a control electrode formed on the semiconductor substrate at a position between the first and second main electrodes; and a capacitor provided with a bottom electrode as well as a ferroelectric film and top electrode sequentially formed on the bottom electrode, wherein a metal film serving as a hydrogen penetration preventing film is formed on the side opposite the semiconductor substrate across an insulating film, with the top electrode interposed therebetween, and the metal film is formed also as the wiring layer of an integrated circuit disposed outside the area in which the transistor and capacitor are formed.

8. The semiconductor element according to claim 7, wherein a plurality of top electrodes are arranged in parallel to each other in a specific direction, and the width of the hydrogen penetration preventing film in the direction orthogonal to the specific direction is equal to or greater than the maximum width of the top electrodes in said orthogonal direction.

9. The semiconductor element according to claim 7, wherein the hydrogen penetration preventing film is used as a separate wiring layer different from the wiring layer that extends in the same direction as a specific direction in which the top electrodes are arranged in a parallel manner.

10. The semiconductor element according to claim 7, wherein the hydrogen penetration preventing film comprises a hydrogen-occluding metal film.

11. The semiconductor element according to claim 10, wherein the hydrogen-occluding metal film is at least one film selected from titanium films, palladium films, and zirconium films.

12. The semiconductor element according to claim 10, wherein the thickness of the hydrogen-occluding metal film is 50 nm at minimum.

13. The semiconductor element according to claim 7, wherein the hydrogen penetration preventing film comprises a metal oxide film.

* * * * *